United States Patent [19]

Castro et al.

[11] Patent Number: 5,028,810
[45] Date of Patent: Jul. 2, 1991

[54] FOUR QUADRANT SYNAPSE CELL EMPLOYING SINGLE COLUMN SUMMING LINE

[75] Inventors: Hernan A. Castro, Shingle Springs; Mark A. Holler, Palo Alto, both of Calif.

[73] Assignee: Intel Corporation, Santa Clara, Calif.

[21] Appl. No.: 526,070

[22] Filed: May 18, 1990

Related U.S. Application Data

[63] Continuation-in-part of Ser. No. 379,933, Jul. 13, 1989, Pat. No. 4,956,564.

[51] Int. Cl.$^5$ ............................................. H03K 19/21
[52] U.S. Cl. ..................................... 307/201; 307/464; 307/529; 364/807; 365/185
[58] Field of Search ................ 307/201, 529, 464–465; 364/513, 807; 366/184–185

[56] References Cited

U.S. PATENT DOCUMENTS

| | | | |
|---|---|---|---|
| 4,660,166 | 4/1987 | Hopfield | 364/807 |
| 4,695,979 | 9/1987 | Tuvell et al. | 365/185 |
| 4,731,747 | 3/1988 | Deuker | 307/201 X |
| 4,760,437 | 7/1988 | Denker et al. | 357/30 |
| 4,782,460 | 11/1988 | Spencer | 364/807 |
| 4,802,103 | 1/1989 | Faggin et al. | 364/513 |
| 4,945,257 | 7/1990 | Marrocco, III | 307/201 |
| 4,961,005 | 10/1990 | Salam | 307/201 |
| 4,999,525 | 3/1991 | Park et al. | 307/201 |

FOREIGN PATENT DOCUMENTS

0121987  5/1988  Japan ................................. 307/201

OTHER PUBLICATIONS

Mackie et al., "Implementations of Neural Network Models in Silicon", NATO Advanced Research Workshop, Neuss, F.R.G., 28 Sep.–2 Oct. 1987.
Hollis et al., "Artificial Neurons Using Analog Multipliers", N. C. State Univ., Manuscript rec'd Dec. 1988.

Primary Examiner—David Hudspeth
Attorney, Agent, or Firm—Blakely, Sokoloff, Taylor & Zafman

[57] ABSTRACT

The present invention covers a synapse cell for providing a weighted connection between a differential input voltage and a single output summing line having an associated capacitance. The connection is made using one or more floating-gate transistors which provide both excitatory as well as inhibitory connections. As configured, each transistor's drain is coupled to an input line and its source is coupled to the output summing line. The floating-gate of the transistor is used for storing a charge which corresponds to the strength or weight of the neural connection. When a voltage pulse having a certain duration is applied to the control gate of the floating-gate transistor, a current is generated which acts to discharge the capacitance associated with the output summing line. The current is directly proportional to the charge stored on the floating-gate member and the duration of the input pulse.

21 Claims, 4 Drawing Sheets

FIG_1

FIG_2

FIG_3

FIG_4

FIG_5

FIG_6

FIG_7

FIG_8

FIG_9

FOUR QUADRANT SYNAPSE CELL EMPLOYING SINGLE COLUMN SUMMING LINE

CROSS-REFERENCE TO RELATED APPLICATIONS

This application is a continuation-in-part (CIP) application of Ser. No. 07/379,933; now U.S. Pat. No. 4,956,564 filed July 13, 1989; entitled "Adaptive Synapse Cell Providing Both Excitatory and Inhibitory Connections in an Associative Network", which is assigned to the assignee of the present invention.

FIELD OF THE INVENTION

The invention pertains to the field of associative networks for emulating higher-order functions performed in the cortex of the human brain. More particularly, the invention pertains to synapse cells which provide a weighted connection between an input voltage vector and a neural summing device.

BACKGROUND OF THE INVENTION

A great deal of effort has recently been focused on developing electronic circuits which emulate higher-order brain functions such as memory learning and/or perception/recognition.

One class of circuit devices which sense an input event and output a pattern of signals which identifies that event are association networks. Association networks generally take the form of a matrix comprised of horizontal lines crossing and contacting an equally sized set of vertical lines. The horizontal lines simulate the functions of axons in the cortex of the brain and are used as inputs. The vertical lines simulate the function of dendrites extending from neurons. Each vertical line terminates at a voltage summing device which acts to simulate the function of the neuron cell body. An example of such an associative network is found in co-pending application entitled "Semiconductor Cell For Neural Network Employing A Four-Quadrant Multiplier", Ser. No. 07/283,553, now U.S. Pat. No. 4,950,917 filed Dec. 9, 1988, which is assigned to the assignee of the present application.

Within an associative network, neural synapses are simulated by circuit cells which provide electrical connection between the horizontal and vertical lines of the network. Individual synapses provide a weighted electrical connection between an input an a voltage summing element, i.e., a neuron.

These synapse cells may be either analog or digital in nature. For an analog implementation, the weighted sum of input signals is usually computed by summing analog currents or charge packets. For a general description of an associative network processing unit consisting of analog connection elements, see "VLSI for Artificial Intelligence", edited by Jose G. DelGado-Frias and Will R. Moore, Kluwer Academic Publishers, 1989, pp. 230-233.

One of the most difficult and critical tasks faced by researchers in the field of neural networks is the integration of the synapse cells, also referred to as contact structures. The several realizations that have been proposed range from non-programmable binary to programmable analog interconnections.

In an analog synapse cell, considerations of cell size and resolution of the connection weight must be carefully balanced. Furthermore, learning within an associative network requires adaptive weight values since a typical network system cycles through a series of weight changes until the entire network converges to a certain pattern which depends upon the pattern of inputs applied. Several synapse cell circuits are described in co-pending applications "EXCLUSIVE-OR Cell For Neural Network Cell And The Like", Ser. No. 309,247, now U.S. Pat. No. 4,904,881 filed Feb. 10, 1989; and "EXCLUSIVE-OR Cell For Pattern Matching And Employing Floating-Gate Devices", Ser. No. 325,380, now U.S. Pat. No. 4,999,525 filed Mar. 17, 1989, both of which are assigned to the assignee of the present application.

FIG. 2 of U.S. Pat. No. 4,802,103 of Faggin et al., discloses a contact structure which utilizes a floating-gate transistor 34. Device 34 is used to discharge a target line of the network in proportion to the amount of charge stored on the floating gate member of device 34. The magnitude of the convergence response of the network is altered by incrementally erasing the floating gate transistors. In other words, the connection strength is increased to increase the discharge current associated with the target line. A detecting circuit indicates a convergence response once a predetermined amount of charge is removed from the target line.

The chief drawback of the contact structure of Faggin's FIG. 2 is that it operates as a simple one-quadrant device. That is, Faggin's synapse cell only produces a positive activation function, corresponding to an activated excitatory connection. It is well understood that biological memories accommodate both excitatory and inhibitory connections—thus providing both positive and negative responses. Electrically, such a synapse presents either a positive or a negative resistance between an axon (i.e., input) and a dendrite (i.e., output summing line) coupled to a neuron body. A cell providing both excitatory and inhibitory connections would more closely resemble the actual function performed by a synapse within the human brain. Moreover, such a cell would have the potential to learn quicker, thereby providing faster convergence within an associative network. Therefore, what is needed is an integrated four-quadrant synapse cell which can produce both positive and negative responses.

Certain types of synapse cells do implement four-quadrant multiplication of an input pattern and a stored weight. However, these cells suffer from several important drawbacks. First of all, previous approaches generally involve numerous devices requiring large silicon areas. In many cases, they employ p-channel devices which necessitate the formation of extra n-well regions. This further increases the silicon area consumed. In addition, conventional four-quadrant synapse cells typically require the use of differential output summing lines, also referred to as column lines or bit lines, which again contribute to the complexity and size of the network.

As will be seen, the present invention covers a compact and elegant synapse cell employing a pair of floating-gate transistors coupled to a single output summing line. The invention offers the advantage of four-quadrant performance while obviating the complex synapse circuitry and differential bit lines normally associated with multi-quadrant devices. Importantly, the cell of the present invention achieves very high densities while still providing full incremental learning capabilities.

Other prior art known to Applicant includes: U.S. Pat. No. 4,760,437 of Denker et al.; U.S. Pat. No.

4,660,166 of Hopfield; U.S. Pat. No. 4,782,460 of Spencer; "Programmable Analog Synapses For Micro Electronic Neural Networks Using A Hybrid Digital-Analog Approach", by F. J. Mack et al., *IEEE International Conference on Neural Networks*, July 24–27, San Diego, Calif.; and "A Pipelined Associative Memory Implemented In VLSI", by Clark et al., *IEEE Journal of Solid-State Circuits*, Vol 24, No. 1, pp. 28–34, February 1989.

SUMMARY OF THE INVENTION

The present invention covers a synapse cell for providing a resistive connection between a differential applied input and a single output summing line coupled to a neuron. In one embodiment, connection between the differential input and single output line in the associative network is made using a pair of floating-gate transistors, wherein the transistor's drain regions are coupled across the input lines while the common source regions are coupled to the output line. The output summing line in an associative network is usually connected to a voltage sensing element, such as a non-linear amplifier, which simulates the function of the neuron body in a biological neuron.

The floating-gate of one of the transistors is selectively charged to store a weight which, depending upon the choice of transistor and the particular applied voltage coupled to that device, corresponds to either a positive or a negative effective resistance. Usually, the differential input voltage is symmetrical about a reference voltage applied to the output column line. The other floating-gate device is programmed to have its floating gate fully charged (i.e., off).

For the situation where a binary voltage pulse having a certain duration is applied across the drain region of the active floating-gate transistor, a current is generated which acts to discharge the capacitance associated with the output summing line. Since the current, and therefore the resulting discharge, is directly proportional to the charge stored on the floating-gate member and the duration of the input pulse, the synapse cell of the present invention performs a multiplication function.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE PREFERRED EMBODIMENT(S)

A novel single column synapse cell is disclosed for weighted connection between a differentially applied input vector and a single output summing line. In the following description, numerous specific details are set forth such as specific voltages, device types, etc., in order to provide a thorough understanding of the present invention. It will be obvious, however, to one skilled in the art that these specific details need not be employed to practice the present invention. In other instances, well-known structures and techniques are not described in detail in order to avoid unnecessarily obscuring the present invention.

Figure 1:
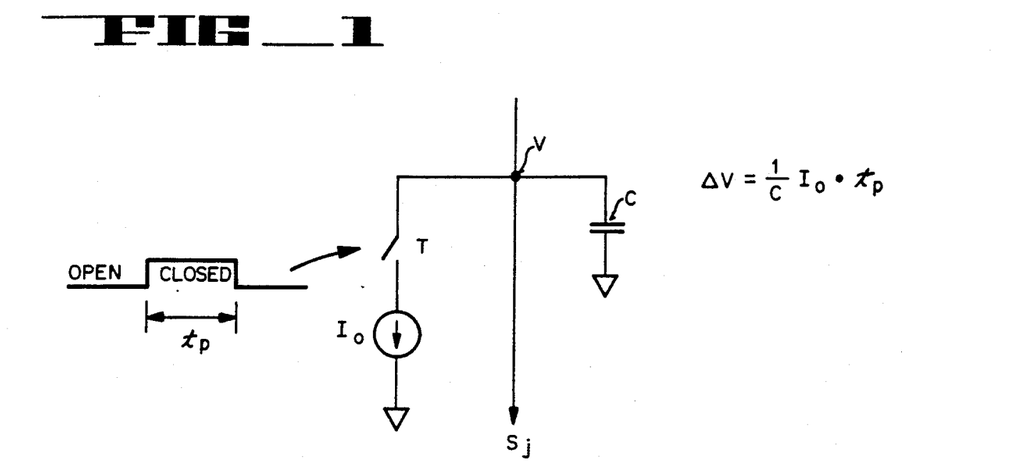
FIG. 1 shows a basic circuit model of a contact structure which emulates the function of a synapse in the cortex of the human brain.

Referring to FIG. 1, there is shown a basic circuit model of a contact structure which emulates the function of a synapse in the human brain (for reference, see p. 104 of "Principles of Neuroscience" by Kandell & Schwartz, 2nd ed., Elsevier). The circuit of FIG. 1 includes an analog current summing line $S_j$ which terminates at the input of a neural summing device. Line $S_j$ carries the sum of the individual current contributions of each of the synapse cells associated with that line. Line $S_j$ is shown having a capacitance C coupled to node V. Also connected to node V is a switched current source supplying a constant current of $I_0$ when switch T is closed. The circuit of FIG. 1 is activated during the time interval $t_p$ when switch T is closed.

As would be evident to one skilled in the art, the circuit of FIG. 1 is a basic capacitive discharging circuit. A predetermined amount of charge stored on capacitor C is drained in direct proportion to the product of the current $I_0$ and the time interval $t_p$. Thus, using the basic contact structure of FIG. 1, an input signal in the form of a voltage pulse having a non-zero duration produces a convergence response which may then be totaled with other responses and compared to a threshold value.

The charge in voltage which occurs at node V in response to an input pulse is a multiple of the current $I_0$ (i.e., stored weight) and the time period $t_p$ (i.e., cell input to the), as given by the equation $$\Delta V = \frac{1}{C} I_0 t_p$$

A simple learning rule for programming the contact structure of FIG. 1 is to increase the current $I_0$ for all contacts coupled to an active input line and a summing line from which a response is desired. This has the effect of strengthening the synaptic connection.

Figure 2:
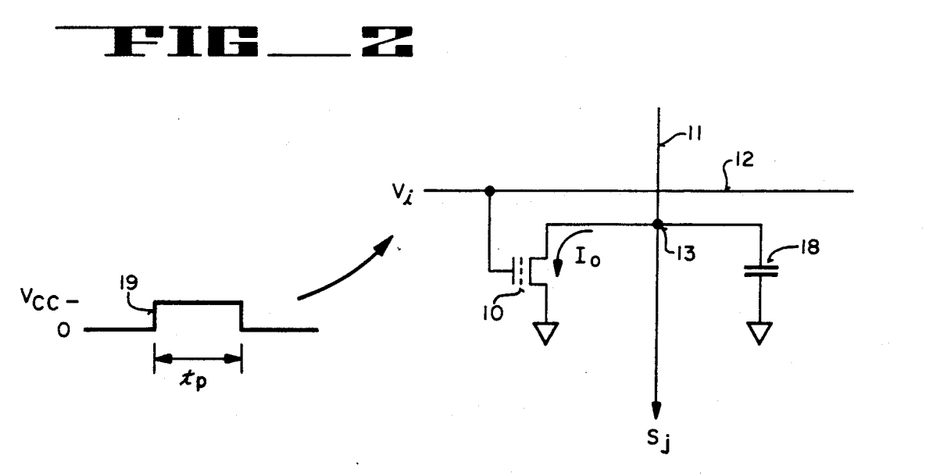
FIG. 2 shows a synapse cell employing a single floating-gate transistor.

FIG. 2 illustrates a good functional integration of the contact structure represented by the circuit model of FIG. 1. In FIG. 2, the constant current source $I_0$ is realized by a transistor 10 which has a floating-gate member that is electrically chargeable. Most often, transistor 10 is fabricated with a polysilicon floating-gate which is completely surrounded by insulation (e.g., silicon dioxide). Charge is transferred out of the floating-gate through a variety of mechanisms such as avalanche injection, channel injection, tunnelling, etc. It is the charge on the floating-gate which affects the conductivity of the device. If the conductivity is above a certain level, the device is deemed to be programmed in one binary state. If the conductivity is below another level, it is deemed to be programmed in the other binary state. For analog applications, the floating-gate charge is controlled to provide intermediate levels of conductivity between the upper and lower limits.

Floating-gate transistors take a variety of forms in the prior art, some being both electrically erasable and electrically programmable and others requiring, for example, ultraviolet light for erasing. These non-volatile storage devices are frequently referred to in the prior art as EPROMs, EEPROMs or flash EEPROMs. One embodiment of the present invention employs standard flash EPROM devices augmented with ordinary select transistors, although standard EEPROMs or EPROMs may be readily substituted without detracting from the spirit or scope of the present invention.

With reference to FIG. 2, the application of an input voltage pulse having a non-zero duration $t_p$ to input line 12 (labeled $V_i$) causes a current $I_0$ to flow in transistor 10. The magnitude of the current $I_0$ depends on the stored charge programmed onto the floating-gate of transistor 10. As is shown, the control gate of device 10 is coupled to input line 12, the drain of device 10 is coupled to node 13 of line 11 and the source is grounded. The current $I_0$ acts to incrementally discharge capacitor 18 connected to line 11 at node 13. This causes a corresponding change in the voltage present on line 11.

Consider in more detail the case wherein an input voltage pulse of a certain duration $t_p$ is applied to input line 12. The value of the input voltage is digital in nature, assuming either a value of 0 volts or the supply potential, e.g., $V_{CC}$. The pulse width, however, is analog in nature and is used to represent a value in a continuum of possible input values. Upon the arrival of the input pulse on line 12, floating gate transistor 10 conducts a current $I_0$. Of course, the magnitude of the current $I_0$ depends on the actual charge residing on the floating gate member of transistor 10. Preferably, transistor 10 is an n-channel device so that if a large amount of negative charge resides on the floating-gate member, then the magnitude of $I_0$ will be relatively small. On the other hand, if a small amount of negative charge, or a positive charge, resides on the floating-gate then the magnitude of $I_0$ will be relatively large.

As discussed, the current $I_0$ acts to drain a predetermined amount of charge from capacitor 18. It is appreciated that the charge may be stored in a variety of alternative ways. For instance, instead of using a separate storage capacitor, the parasitic capacitance associated with line 11 may itself be used to store the charge.

During the time that input line 12 is high, a quantity of charge is drained off of line 11 which corresponds directly to the product of the current $I_0$ and the time period $t_p$. The voltage at node 13 drops accordingly. Hence, the invented synapse cell of FIG. 2 acts as a type of one-quadrant multiplier—providing an output which depends upon the product of an input pulse width and the amount of charge stored on the floating-gate of transistor 10 (i.e., the stored charge on the floating-gate representing the adaptive weight).

Use of pulse widths to represent inputs to the synapse cell is more power efficient than conventional voltage level-sensing schemes because current flows only during the active portion of the pulse width, i.e., when the pulse is "high". Therefore, quiescent power consumption in the cells is markedly reduced.

To reduce transient current spikes, the leading edge transitions 19 (see FIG. 2) of the input pulses applied to the various synapses may be randomly skewed in time with respect to one another. One way to accomplish this would be to utilize a high-speed free-running clock to drive a counter which would then trigger the various transition points of the input pulses. In this way, the input pulses would be applied relatively asynchronously with respect to the other pulses; never allowing a multitude of transitions to occur at the same time. If a plurality of input pulses were synchronized so that their leading edge transitions 19 occurred simultaneously, large transient currents would result. Obviously, such currents are undesirable. Note that the human brain generates pulses which are asynchronous, possibly for the same reason.

Programming and erasing of the cell of FIG. 2 can be accomplished in the manner well-known in the prior art. For example, for the case in which flash EPROM devices are employed, device 10 may be programmed by taking its control gate (connected to input line 12) and its drain (connected to summing line 11) to a high positive potential. High positive voltages on the control gate and the drain of device 10 cause hot-electrons to be injected onto the floating-gate, thereby raising its threshold.

All of the floating-gate transistors within the associative network can be erased simultaneously by raising the common source to a high positive potential as is typically done in flash EPROM devices. For instance, to erase transistor 10, the control gate connected to line 12 is taken to a voltage at or near ground potential. The application of a high positive potential to the common source, while its control gate is grounded, causes electrons to tunnel from the floating gate to the source. This "erase process" reduces the threshold of the floating-gate transistor.

Figure 3:
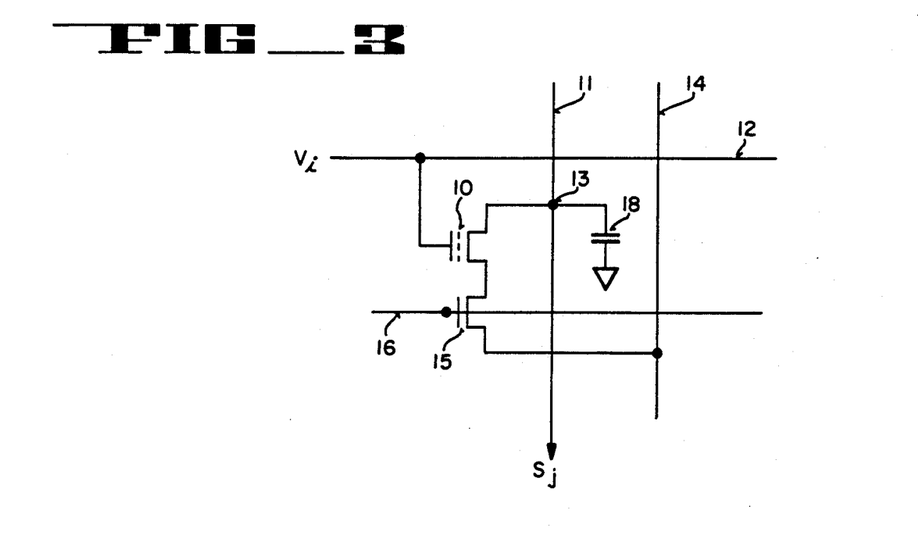
FIG. 3 illustrates the one-quadrant synapse cell of FIG. 2 also having an additional transistor to facilitate selective programming/erasing.

To erase floating-gate devices within a synapse cell more selectively, a separate source select field-effect device is required. Such a circuit configuration which includes a source select field-effect device 15 is shown in FIG. 3. Device 15 comprises an ordinary n-channel MOS transistor. When the select line 16, coupled to the gate of device 15, is raised to a high positive potential, the source of transistor 10 is electrically coupled to line 14. A high positive programming potential (e.g., $V_{PP}$) is then applied to the source of floating-gate device 10 via line 14. During a selective erase, all of the other select lines within the network will generally be grounded. In a normal read or association operation all of the select lines in the network are taken high and their associated programming potential lines (e.g., line 14) are grounded.

The addition of select device 15 roughly doubles the cell size of the connection element; however, device 15 does add the ability to change the stored weight in either direction, i.e., either positive or negative. For instance, the weight stored in device 10 may be either increased, by incremental programming (i.e., charging) of the floating-gate member of device 10, or decreased by incrementally erasing (i.e., discharging) device 10.

Because the cortex of the human brain has both excitatory as well as inhibitory connections, an accurate synapse implementation must be able to produce positive as well as negative responses. This means that the synapse cell must be capable of either two-quadrant or four-quadrant multiplication. It has been shown that inhibitory connections are necessary for a neural network to be fully general for mapping input patterns to output patterns.

Figure 4:
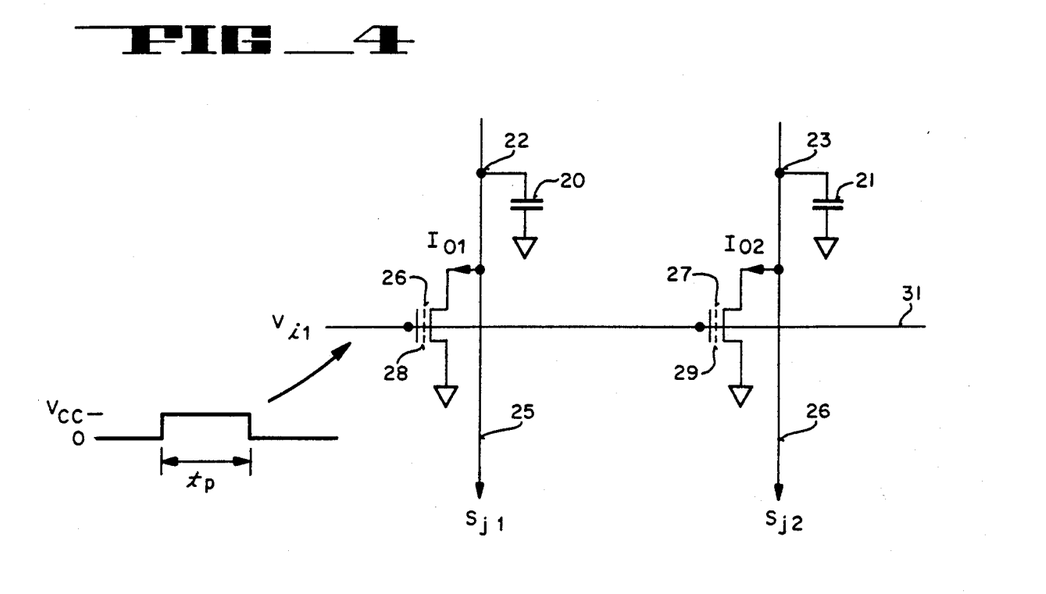
FIG. 4 shows one embodiment of a two-quadrant synapse cell providing multiplication of an input voltage and a stored weight.

The synapse cell of FIG. 4 implements a two-quadrant multiply in which a differential voltage is produced in response to an input voltage pulse. The cell includes two floating-gate transistors 26 and 27 each having a corresponding floating-gate member 28 and 29, respectively. Transistor 26 has its drain coupled to current summing line 25 (labeled $S_{j1}$) while transistor 27 has its drain coupled to current summing line 26 (labeled $S_{j2}$). The capacitances associated with lines 25 and 26 are represented in FIG. 4 by capacitors 20 and 21, coupled to nodes 22 and 23, respectively. (It is understood, of course, that the actual implementation of capacitors 20 and 21 may take a variety of forms, as mentioned above).

A bipolar weight pattern (the term "bipolar" in this context refers to the ability of the weight to be either excitatory or inhibitory) is stored in the cell of FIG. 4 by programming different voltages onto floating-gate members 28 and 29. By way of example, a positive weight may be defined by a voltage $V_{28}$ on floating-gate member 28 which is greater than a voltage $V_{29}$ stored on floating-gate member 29. Logically, a negative weight is then defined by the case in which $V_{29}$ is greater than $V_{28}$.

Upon the application of a voltage input pulse of duration $t_p$, each floating-gate transistor conducts a current which is directly related to the stored weight. For instance, for the case in which positive weight has been programmed (i.e., $V_{28} > V_{29}$) the current $I_{01}$ is made larger than the current $I_{02}$. Therefore, the change in the voltage associated with the voltage at node 22 will be greater than the change in voltage at node 23 (i.e., more electrical charge will be removed from capacitor 20 than from capacitor 21). This result may be conventionally defined as a positive output response. A negative output response would result whenever $I_{02}$ is greater than $I_{01}$, with capacitor 21 discharging more than capacitor 20. Thus, the cell of FIG. 4 is capable of producing both excitatory and inhibitory connections to a neural summing device.

Figure 5:
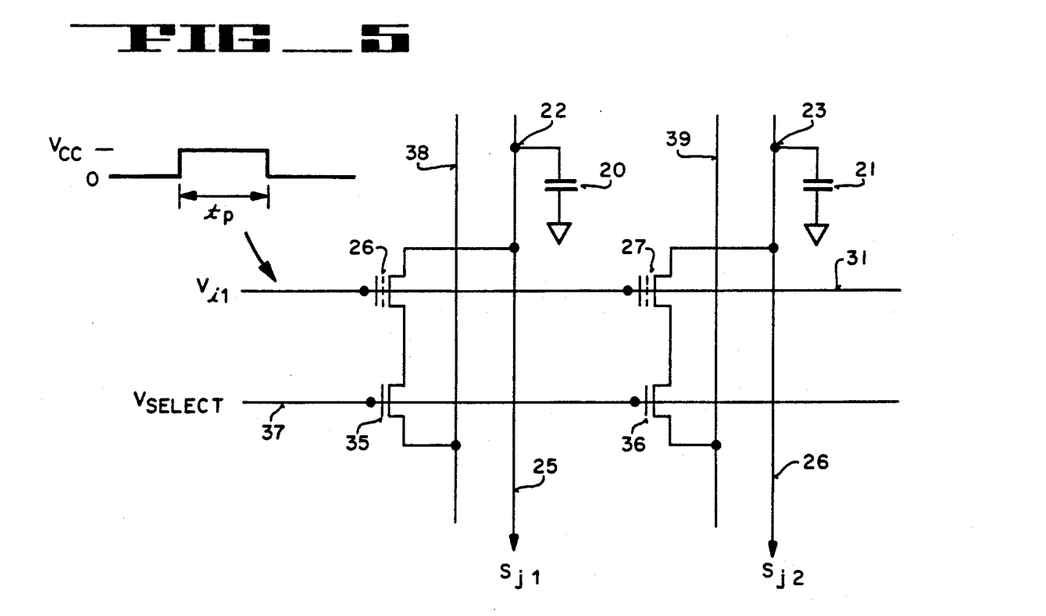
FIG. 5 shows another embodiment which the two-quadrant cell of FIG. 4 incorporates additional transistors to facilitate selective programming/erasure.

Referring now to FIG. 5, the two-quadrant synapse cell of FIG. 4 is shown incorporating additional transistors 35 and 36 to facilitate selective programming and erasing of floating-gate devices 26 and 27. Select transistors 35 and 36, which in the preferred embodiment are ordinary n-channel MOS devices, both have their gates coupled to select line 37 and their drains coupled to the sources of floating-gate transistors 26 and 27, respectively; their sources are coupled to common source lines 38 and 39, respectively.

As described in conjunction with FIG. 3, the addition of select devices 35 and 36 adds the ability to alter, or adapt, individual stored weights in either direction. This gives the synapse cell of FIG. 5 the potential for faster learning (i.e., quicker convergence response) when compared to simpler one-quadrant structures.

It is appreciated that by using time integration techniques the need for precise matching of the transistor devices is considerably relaxed. As long as the current flowing through each of the floating-gate devices remains constant during the time $t_p$, the multiplication process will be linearly precise (assuming, of course, that the associated summing line capacitance is itself linear). Further, by providing the capacity for incremental programming and erasing through the use of select devices 35 and 36, the circuit of FIG. 5 supports full incremental learning in an associative network.

A synapse capable of full four-quadrant multiply is important because it allows representation of input vector components in the range from $-1$ to $+1$ instead of from 0 to $+1$. The length (i.e., magnitude) of vectors with digital components of $-1$ and $+1$ is constant while the length of vectors with components 0 and $+1$ varies considerably. Neurons with synapses which carry out a dot product calculation can more reliably learn to recognize different pattern vectors of equal lengths as opposed to vectors whose length varies.

Figure 6:
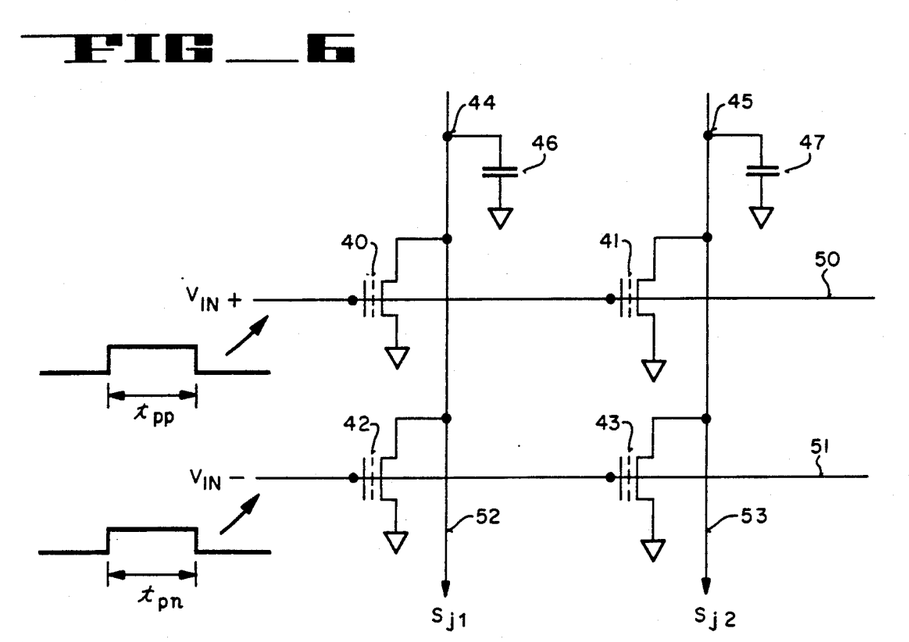
FIG. 6 illustrates a four-quadrant synapse cell connecting a differential input to a differential output summing line.

Full four-quadrant multiplication is achieved by using differential input and output lines as shown in FIG. 6. The synapse cell of FIG. 6 comprises input lines 50 and 51 coupled to the gates of floating-gate transistors 40, 41 and 42, 43, respectively. The drains of transistors 40 and 42 are coupled to current summing line 52 (labeled $S_{j1}$), while the drains of devices 41 and 43 are coupled to current summing line 53 (labeled $S_{j2}$). Summing line 52 has an associated capacitance 46 coupled at node 44 and current summing line 53 has a similar capacitance 47 coupled at node 45.

For positive inputs, a voltage pulse having a time period $t_{PP}$ is supplied to line 50, for example, while for negative inputs, a voltage pulse of time period $t_{PN}$ may be applied to input line 51. As before, the length or duration of the pulse is proportional to the magnitude of the input. The current produced through the floating-gate devices is a multiple of the input pulse duration and the stored weight pattern in devices 40–43. Note that only one input voltage pulse is applied to the cell of FIG. 6 for a given input. In other words, the positive input would have a pulse applied to lines 50 while line 51 remains grounded. Conversely, a negative input would have a pulse applied to line 51 while line 50 remains grounded.

The floating-gate potentials are represented in FIG. 6 by the voltages of $V_{40}$–$V_{43}$, corresponding to the floating-gate transistors 40–43. A positive weight pattern may be defined for the case in which $V_{41}$ is greater than $V_{40}$ and $V_{42}$ is greater than $V_{43}$. For this situation, when a positive input is applied (i.e., $t_{PP} > 0$ and $t_{PN} = 0$) more current will flow through the floating-gate transistor 41 relative to transistor 40. Therefore, the change in voltage produced at node 45 due to the discharge of capacitor 47 will be greater than the change in voltage produced at node 44 from the discharge of capacitor 46. This output condition may be arbitrarily defined as a negative output response. Logically, a positive output response would then correspond to the situation in which the change in voltage produced at node 44 was greater than the change in voltage produced at node 45.

Consistent with the convention described, a negative stored weight pattern would correspond to the situation in which the voltage $V_{40}$ is greater than $V_{41}$ and $V_{43}$ is greater than $V_{42}$. Applying a positive input (i.e., $t_{PP} > 0$; $t_{PN} = 0$) to the cell of FIG. 6 storing a negative weight pattern produces a discharge on line 52 which is greater relative to the discharge experienced on line 53, i.e., a positive output response. Applying a negative input (i.e., $t_{PP} = 0$; $t_{PN} > 0$) to the cell of FIG. 6 storing a negative weight produces a discharge on line 53 which is greater relative to that experienced on line 52, i.e., a negative response. Similarly, applying a negative input to a positive stored weight pattern results in a positive output response.

To recapitulate, in accordance with the conventions described above, a positive input applied to a positive weight produces a negative response; a negative input applied to a positive weight produces a positive response; a negative input applied to a negative weight produces a negative response; and a positive input applied to a negative weight results in a positive response. Thus, the cell of FIG. 6 delivers a full four-quadrant multiply, providing both excitatory and inhibitory connections.

It is appreciated that with respect to the discussion of FIGS. 2-6, the capacitors associated with the output current summing lines must be pre-charged before each new input pulse sequence or association cycle is applied.

Full incremental learning capabilities may be incorporated into the cell of FIG. 6 by including select transistors coupled to the sources of each of the floating-gate transistors 40-43. These transistors would be arranged in accordance with the teachings of FIG. 3 and FIG. 5. That is, each select device would have its gate coupled to a voltage select line and its source coupled to a separate programming potential line. Programming and erasing may then take place in a manner as described above in connection with FIGS. 2-5. Such a circuit configuration employing select transistors for programming and erasing ease is shown in FIG. 7.

Figure 7:
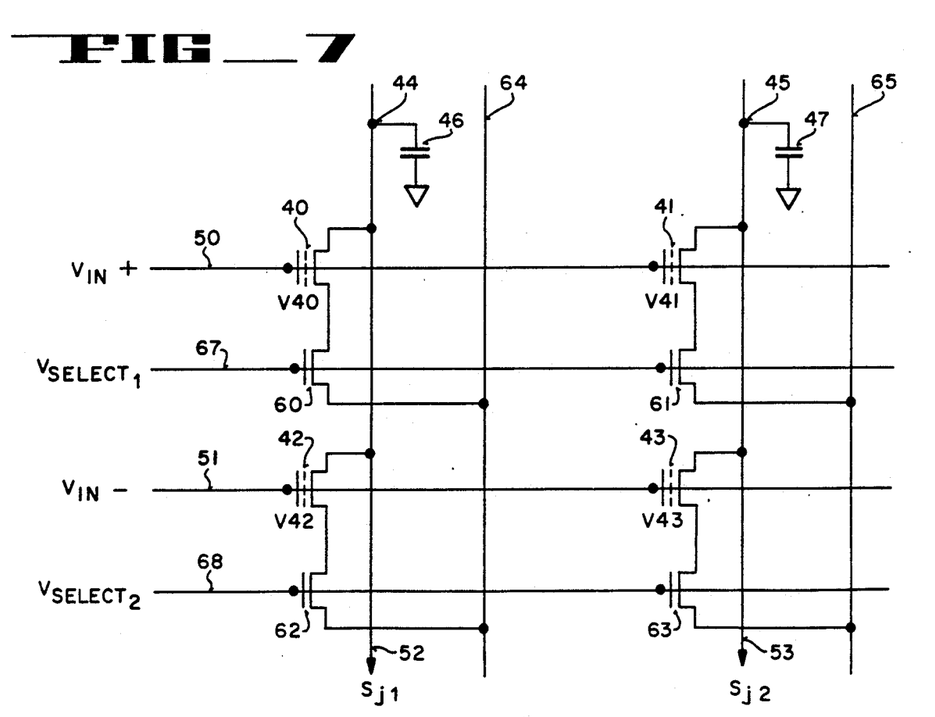
FIG. 7 shows the four-quadrant cell of FIG. 6 incorporating additional transistors to facilitate selective programming/erasure.

FIG. 7 illustrates n-channel select transistors 60-63 coupled to floating-gate transistors 40-43, respectively. Voltage select line 67 is coupled to the gates of transistor 60 and 61 while select line 68 is coupled to the gates of transistor 62 and 63. Transistor 60 and 62 have their sources coupled to line 64, while devices 61 and 63 have their sources coupled to line 65. Lines 64 and 65 provide appropriate potentials to the sources of transistors 40-43 during programming, erasing and normal read operations.

DISCUSSION OF THE EMBODIMENTS OF FIGS. 8 & 9

One of the main drawbacks associated with the synapse cells of FIGS. 3-7 is the fact that the product of the input vector and stored weight is output differentially onto summing lines $S_{j1}$ and $S_{j2}$. As a consequence, a large common mode current component normally flows along these output summing lines. Since information is only provided by the difference current between the respective summing lines, this common mode component results in wasteful and unnecessary power dissipation within the network. Moreover, additional and more complex circuitry is needed to accommodate a differential output summing line scheme. Ultimately, this leads to larger synapse cells which consume greater device area.

Figure 8:
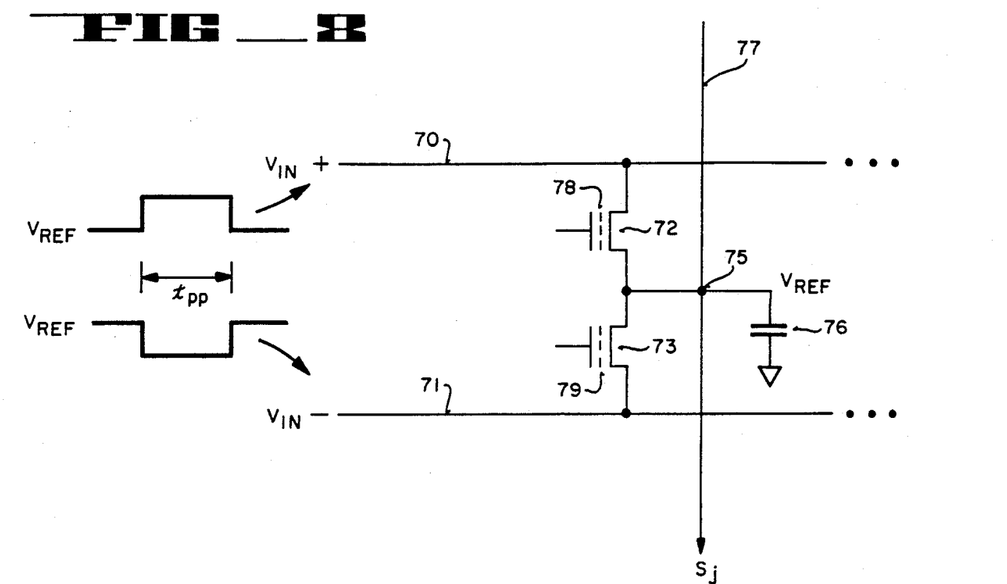
FIG. 8 shows the four-quadrant cell of the currently preferred embodiment of the present invention in which a differential input voltage is multiplied by stored weight and is output to a single column line.

With reference to FIG. 8, a compact, elegant four-quadrant synapse cell employing a single output summing line is illustrated. The cell comprises two floating gate field-effect transistors 72 and 73 having their drains coupled to input lines 70 and 71, respectively. The sources of floating gate transistor 72 and 73 are commonly coupled to output summing line 77. According to the currently preferred embodiment of the invention, column line 77 has an associated capacitance 76 which stores a reference voltage $V_{ref}$. Currently, an external bias circuit is used to generate a reference voltage of ~1 volt on line 77 during normal operation.

Transistors 72 and 73 include floating gate members 78 and 79, respectively, which store electrical charge in a capacitive manner. Programming or erasing of transistors 72 and 73 may be performed in the manner described above in connection with FIGS. 3-7. That is, application of high positive voltages to the control gate and drain of device 72 cause hot electrons to be injected onto floating gate member 78. Alternatively, tunnelling may be relied upon to transfer charge from the substrate to the floating gate member. Erasing is generally accomplished by grounding the control gate while raising the drain and/or source regions to a similarly high positive potential.

A weight (i.e., charge) is set to either of transistors 72 or 73 by pulsing the control gate with a high positive potential during programming. The length or duration of the pulse determines the magnitude of the weight programmed onto either of floating gates 78 or 79. Obviously, a voltage pulse having a very long duration will generate a resultant floating gate charge which will render the device nonconductive (i.e., the device will be "off"). During normal network operations, the control gates of devices 72 and 73 are taken to a suitable reference voltage.

To better understand the operation of the circuit of FIG. 8 consider the following example. Assume that devices 72 and 73 are to multiply a digital input vector by a digital weight pattern. (While the single column version of the synapse cell of FIG. 8 is probably most appropriate for digital applications, it is appreciated by practitioners in the art that analog weight values and inputs may also be used with equal effectiveness.) For the purpose of this example, assume that the synapse cell stores a positive digital weight—arbitrarily defined as the condition wherein transistor 73 is off (i.e., fully programmed) while a variable voltage is stored on the floating gate 78 of transistor 72. Transistor 72 thus stores a weight which may be thought of as a sort of variable resistance between input line 70 and bit line 77. Importantly, the only current path for the above described case is through device 72.

According to the above convention, a negative digital weight is defined by having device 72 off while device 73 is programmed to some intermediate level—such that the only current path through the synapse cell is from input line 71 to output line 77. Again, depending on the level of stored charge on floating gate 79, device 73 establishes an effective resistance between input line 71 and bit line 77. As will be explained in further detail, this effective resistance may be either positive or negative in value, depending on which device, 72 or 73 has been chosen to be active (i.e., not off).

Once again assuming that the cell of FIG. 8 is programmed to store a positive digital weight, consider the effect that an applied input has on the network. In accordance with the preferred embodiment, input voltages appearing on lines 70 and 71 are applied symmetrically about reference voltage $V_{ref}$. For example, FIG. 8 illustrates a positive input voltage $V_{IN+}$ having a positive relative voltage (i.e., greater than $V_{ref}$) applied for a duration $t_{PP}$. Simultaneously, a negative input voltage $V_{IN-}$ is applied to line 71. $V_{IN-}$ has a negative relative voltage (i.e., less than $V_{ref}$) which is applied symmetrically with respect to $V_{IN+}$ about reference voltage $V_{ref}$.

In other words, a positive input voltage vector is arbitrarily defined to consist of a positive input voltage (e.g., preferably 2 volts) applied along line 70 together with an equal and opposite negative input voltage (e.g., preferably 0 volts) applied to line 71, such that each input is symmetric about the voltage $V_{ref}$ (e.g., 1 volt). Both input pulses, $V_{IN+}$ and $V_{IN-}$, are shown in FIG. 8 as having a duration $t_{PP}$, consistent with the descriptions of FIGS. 1-7. Both inputs are symmetric about the reference voltage $V_{ref}$ meaning that each input is equal and opposite in both time, duration and voltage amplitude about the reference voltage. Consistent with the above-described convention, a negative input voltage vector consists of the case in which a negative voltage $V_{IN-}$ is applied to line 70 and a positive voltage $V_{IN+}$ is applied to line 71.

For the circumstance in which a positive input voltage is applied to a synapse cell storing a positive digital weight (as defined above) current is supplied along line 70, through device 72, onto summing line 77. For the situation in which a negative input voltage is applied to a synapse cell storing a positive weight, current flows in the opposite direction. That is, because the potential present on line 70 is now below the existing potential on node 75 (due to the bias voltage $V_{ref}$), current flows from line 77 through device 72, back to line 70. Therefore, in this example the synapse cell of FIG. 8 functions as a variable resistor in an idealized neural network.

Four-quadrant multiplication is achieved since the effective resistance provided by the combination of transistors 72 and 73 may be either positive or negative in value. A positive effective resistance value corresponds to the situation in which floating gate transistor 73 is off and the other transistor is sourcing from line 70 onto line 77. For the opposite case, in which the invented synapse cell provides a negative effective resistance, floating gate transistor 72 is off while the other sinks current from line 77 back to line 71. Importantly, this resistance is symmetrical meaning that if the input voltage goes up or down about the reference voltage, the input will either sink or supply current symmetrically. It is very desirable to have both positive and negative resistances since it is believed that biological memories function in this manner.

To complete the discussion of FIG. 8, a positive input applied to a positively stored weight results in current flow through device 72 onto line 77. A negative input applied to a positive weight sinks current off of line 77. Likewise, a positive input applied to a negative stored weight sinks current from line 77 through transistor 73; while a negative input applied to a cell storing a negative weight generates current flow onto summing line 77 through device 73. Thus, the cell of FIG. 8 delivers a full four-quadrant multiply, providing both excitatory and inhibitory connections.

Although the above description is specific to a digital application, analog multiplication is also possible using analog inputs and analog weights. In an analog implementation, the amplitude of the output current produced along the column line depends upon the amplitude of the input (or the duration of the pulse $t_{PP}$) and the strength of the stored weight. In this respect, it should be understood that the input voltage need not be applied as described in conjunction with FIG. 8. It is appreciated that alternative input schemes may be used with equal effectiveness. By way of example, an analog voltage may be applied to either line 70 or 71 while the other line is grounded or held at the voltage reference $V_{ref}$.

Figure 9:
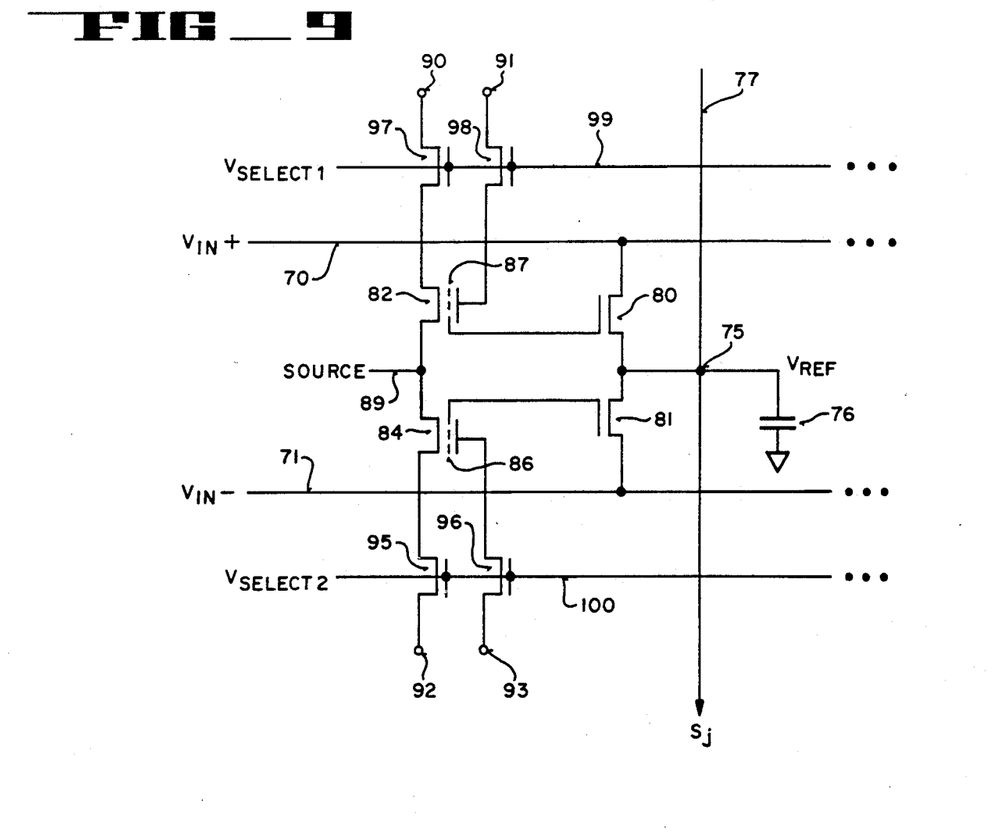
FIG. 9 shows the four-quadrant cell of FIG. 8 incorporating additional transistors to facilitate selective programming/erasure.

FIG. 9 shows an alternative embodiment of the basic cell of FIG. 8 further including additional programming devices. The embodiment of FIG. 9 includes n-channel field-effect transistors 80 and 81 each having their drains coupled to input lines 70 and 71, respectively. The sources of devices 80 and 81 are commonly coupled to node 75 along output summing line 77. As before, output line 77 has an associated capacitance 76. During normal operation, column line 77 is biased to a reference voltage $V_{ref}$.

The control gates of devices 80 and 81 are coupled to floating gate members 87 and 86 of corresponding floating gate transistors 82 and 84, respectively. In a typical n-channel MOS fabrication process, the floating gates of devices 82 and 84 and the control gates of devices 80 and 81 are each formed of polycrystalline silicon (i.e., polysilicon). Having these gate members formed of the same material means that the corresponding gate members may be coupled together simply by patterning an interconnect between the respective devices utilizing the same polysilicon layer.

Floating gate transistor 82 is shown having its drain and control gate coupled to ordinary n-channel devices 97 and 98, respectively. The gates of devices 97 and 98 are coupled to a select line 99, labelled $V_{select1}$, which extends across the network making similar connections to the other synapse cells located within that row. The drains of n-channel devices 97 and 98 are designated as terminals 90 and 91, respectively. Terminals 90 and 91 are coupled to decoder circuits utilized for the programming and erasing of floating gate device 82.

Similarly, the drain and control gate of floating gate device 84 are shown being coupled to ordinary n-channel devices 95 and 96, respectively. Both field-effect devices 95 and 96 have their gates coupled to voltage select line 100, labelled $V_{select2}$. The drains of devices 95 and 96 are labelled as terminals 92 and 93, respectively. Once again, these terminals are coupled to decoder circuits utilized in the programming and erasing of floating gate device 84. The sources of floating gate transistors 82 and 84 are commonly coupled to a source line 89 which also is fully decoded.

The conductance of field-effect devices 80 and 81 is controlled by the charge stored on floating gate members 87 and 86, respectively. For digital applications, the programmed weight pattern stored in floating gate devices 82 and 84 is identical to that described for devices 72 and 73 of FIG. 8. To repeat, a positive weight condition is defined wherein device 84 is fully programmed (i.e., charged) so that current flow is prohibited across the channel of field-effect device 81 (by virtue of the fact that floating gate 86 is coupled to the control gate of device 81). Meanwhile, floating gate device 82 is programmed to some intermediate level such that field-effect device 80 provides a variable resistance between input line 70 and bit line 77.

Just as before, the input applied differentially across lines 70 and 71 is symmetrical about the reference voltage $V_{ref}$ established at node 75 on line 77. Therefore, for the case in which a positive weight is stored in the synapse cell of FIG. 9 and a positive input voltage is applied, current flows from line 70, through device 80, onto column line 77. For the opposite case—where a negative input vector is applied to a positively stored weight—device 80 sinks current from line 77 back to line 70.

When the cell of FIG. 9 is used in an analog manner, the inputs $V_{IN+}$ and $V_{IN-}$ may vary continuously; in most cases remaining symmetric about the reference voltage $V_{ref}$. For this situation, the output current produced along lines 77 is a multiple of the stored charge on the floating gates of either of devices 82 or 84 and the amplitude of the applied input voltage.

To achieve a better response at low analog voltage levels where transistors 80 and 81 approach cutoff, the input voltages applied to lines 70 and 71 may be pulsed as previously described in connection with FIGS. 2–8. Applying a fixed amplitude input over a finite time duration (e.g., $t_{PP}$) results in substantially lower current requirements for a neural network employing the synapse cell of FIG. 9.

As mentioned above, field-effect devices 95–98 along with terminals 90–93 and select lines 99 and 100, are utilized for programming and erasing of devices 82 and 84. By way of example, to store a positive weight pattern into the synapse cell of FIG. 9, terminals 90, 92 and source line 89 are grounded. Select lines 99 and 100 are raised to a high positive potential, e.g., 12 volts, so that field-effect devices 95–98 conduct freely. Next, a high positive potential (e.g., 12 volts) is applied to terminal 93 to cause electrons to tunnel from the substrate to the floating gate of transistor 84. This programs transistor 84 to the point where it is completely off (i.e., non-conductive).

At the same time, a programming voltage is applied to terminal 91 for the purpose of establishing a predetermined charge or weight onto floating gate member 87 of device 82. This weight is established by applying a voltage pulse width to terminal 91 in which the voltage and pulse width both vary in accordance with the desired programming level. Once again, electron tunnelling is employed to transfer charge from the substrate of device 82 onto floating gate 87. As always, the charge present on floating gate member 87 determines the magnitude of the resistive connection between input lines 70 and 71 and column line 77. While the presently preferred programming method relies upon tunnelling, it is appreciated that other programming methods, such as hot-electron injection, etc., may also be used to charge the floating gates in order to establish a weight pattern in the synapse cell of FIG. 9.

To erase devices 82 and 84, terminals 91 and 93 are grounded while terminals 90 and 92 and source line 89 are raised to a high positive potential, e.g., 12 volts in the currently preferred embodiment. This causes electrons to tunnel from floating gate members 86 and 87 back into the substrate of transistors 84 and 82. Once completely erased, transistors 82 and 84 may be reprogrammed to a new weight value. Note that program and erase cycles may be combined to achieve accurate weight values on the same floating gate element.

A brief summary of several of the programming and erasing operations described above is provided in Table 1 below.

TABLE 1

| | $Q_{82}$ = Weight; $Q_{84}$ = Off | $Q_{82}$ = Erased $Q_{84}$ = Erased |
|---|---|---|
| $V_{90}$ | GND | $V_{pp}$ |
| $V_{91}$ | $V_{Pulse}$ | GND |
| Source | GND | $V_{pp}$ |
| $V_{92}$ | GND | $V_{pp}$ |
| $V_{93}$ | $V_{pp}$ | GND |

Whereas many alternations and modifications of the present invention will no doubt become apparent to a person of ordinary skill in the art after having read the foregoing description, it is to be understood that the particular embodiments shown and described by way of illustration are in no way intended to be considered limiting. Therefore, reference to the details of the preferred embodiments are not intended to limit the scope of the claims which themselves recite only those features regarded as essential to the invention.

Thus, a single column synapse cell providing both excitatory and inhibitory connections in an associative network has been described.

We claim:

1. A neural network including a synapse for providing a weighted connection between an axon and a dendrite coupled to a neuron, said synapse receiving a differential voltage from said axon and supplying/sinking a current to/from said dendrite, said dendrite comprising a single summing line, said synapse comprising a pair of floating gate transistors having floating gate members for storing said weighted connection in the form of a charge.

2. The network of claim 1 wherein said axon is coupled differentially across the drains of said floating gate transistors with the sources of said floating gate transistors being commonly coupled to said single summing line such that said current is regulated by said charge.

3. The network of claim 2 further comprising programming means for programming said floating gate transistors.

4. The network of claim 3 wherein said single summing line is biased to a reference potential and said differential voltage is symmetrical about said reference voltage.

5. The network of claim 4 wherein said current is directly proportional to said charge stored on said floating gate members and the amplitude, sign and duration of said differential input.

6. The network of claim 5 wherein said differential voltage and said weighted connection are digital in nature.

7. The network according to claim 6 wherein said differential voltage is pulsed for a certain duration at a constant voltage level.

8. The network of claim 7 wherein said floating gate transistors comprise n-channel devices fabricated in a silicon substrate.

9. A synapse cell for providing a resistive connection between a differentially applied input and a single summing line coupled to a neuron, said cell comprising a pair of floating gate devices having their drains coupled across said differential input, there sources commonly coupled to said summing line, and their floating gates selectively charged such that either a positive or a negative effective resistance is provided by said synapse cell.

10. The network of claim 9 further comprising programming means for programming said floating gate transistors.

11. The network of claim 10 wherein said single summing line is biased to a reference potential and said differential voltage is symmetrical about said reference voltage.

12. The network of claim 11 wherein said current is directly proportional to said charge stored on said floating gate members and the amplitude, sign and duration of said differential input.

13. The network of claim 12 wherein said differential voltage and said weighted connection are digital in nature.

14. The network according to claim 13 wherein said differential voltage is pulsed for a certain duration at a constant voltage level.

15. The network of claim 14 wherein said floating gate transistors comprise n-channel devices fabricated in a silicon substrate.

16. An associative network, four-quadrant synapse cell for providing a weighted connection between a pair of input lines and a single output summing line biased to a reference potential, said cell comprising:

first and second field-effect devices, each having their drains coupled to separate ones of said input lines and their sources commonly coupled to said output line;

a first floating gate transistor having a floating gate member coupled to the gate of said first field-effect device;

a second floating gate transistor having a floating gate member coupled to the gate of said second field-effect device;

said floating gate members of said first and second floating gate transistors each storing electrical charge which regulates the conductivity of said field-effect devices;

a means for selectively programming each of said floating gate transistors to establish said weighted connection such that application of a differential input voltage across said pair of input lines either supplies or sinks a current to or from said output summing line.

17. The synapse cell of claim 16 wherein the magnitude and direction of said current is directly proportional to said weighted connection and the amplitude, sign and duration of said differential input voltage.

18. The synapse cell of claim 17 wherein said differential input voltage is symmetrical about said reference voltage.

19. The synapse cell of claim 18 wherein said synapse cell is fabricated in a silicon substrate.

20. The synapse cell of claim 19 wherein said stored weight and said differential input voltage are digital in nature.

21. The synapse cell of claim 18 wherein said programming means comprises:

third and fourth field-effect transistors coupled to the drain and control gate, respectively, of said floating gate transistor;

fifth and sixth field-effect transistors coupled to the drain and control gate, respectively, of said second floating gate transistor;

said third, fourth, fifth and sixth field-effect transistors, and the sources of said first and second floating gate transistors, being coupled to decoding circuitry for selectively applying programming potentials to said floating gate transistors to cause tunnelling of electrons either from said substrate to said floating gates or from said floating gates to said substrate for each of said floating gate transistors.

* * * * *